United States Patent [19]

Beling

[11] 4,258,276
[45] Mar. 24, 1981

[54] SWITCHING CIRCUIT FOR CONNECTING AN AC SOURCE TO A LOAD

[75] Inventor: Thomas E. Beling, Saxonville, Mass.

[73] Assignee: Sigma Instruments, Inc., Braintree, Mass.

[21] Appl. No.: 918,354

[22] Filed: Jun. 23, 1978

[51] Int. Cl.³ .............................................. H03K 17/72
[52] U.S. Cl. ................................ 307/252 B; 307/311; 323/319
[58] Field of Search ............ 307/252 B, 252 UA, 311; 323/18, 24; 361/88, 91

[56] References Cited

U.S. PATENT DOCUMENTS

| | | | |
|---|---|---|---|
| 3,450,891 | 6/1969 | Riley | 307/252 B |
| 3,648,075 | 3/1972 | Mankovitz | 307/252 UA |
| 3,777,188 | 12/1973 | Mazur | 307/252 UA |
| 3,855,482 | 12/1974 | Wills | 307/252 B |
| 3,902,080 | 8/1975 | St. Clair et al. | 307/252 UA |
| 3,920,955 | 11/1975 | Nakata | 307/252 B |
| 4,021,683 | 5/1977 | Splatt | 307/252 UA |

Primary Examiner—John Zazworsky
Attorney, Agent, or Firm—Toren, McGeady and Stanger

[57] ABSTRACT

In the disclosed circuit, a bilateral breakdown switch such as a triac includes two terminals for connecting an AC source to a load. A variable input arrangement, such as one which includes an LED and a photoresistor, operates a control electrode on the switch to turn the switch on and off in response to an input signal. The switch is disabled when the momentary AC voltage exceeds a predetermined value. This is done by a sensor that senses voltage and a bilateral switching arrangement that responds to the sensor and turns off the switch in response to a voltage higher than a predetermined value. According to one embodiment, the bilateral switching arrangement is composed of two complementarily poled transistors connected in parallel with respective bases connected to the sensor. Series diodes provide unidirectionality for the transistors. Back-to-back parallel diodes connected to the control electrode compensate for the voltage drop caused by the series diodes.

5 Claims, 3 Drawing Figures

SWITCHING CIRCUIT FOR CONNECTING AN AC SOURCE TO A LOAD

BACKGROUND OF THE INVENTION

This invention relates to a switching circuit for connecting an AC source to a load, and particularly to a solid state AC relay circuit which triggers an active switch element such as a triac when the value of the AC voltage to be controlled is substantially zero.

Relay devices generally respond to an input signal and close a switch in a path of main current flow. Where the path of main current flow conducts alternating current between a source and a load, it is desirable to sense the incoming signal and to close the switch during or near the next succeeding passage of the source voltage through zero. This avoids the transient problems that might otherwise occur if the switch were closed at an instant when the AC voltage being controlled had a substantial value.

The most convenient switch available for turning alternating current on and off is a so-called triac, a thyristor that breaks down when a voltage is applied in either direction across the two main electrodes and a correspondingly poled voltage is connected to a gate or control electrode. Conduction continues until the voltage at the main electrodes is removed or reversed. In constrast to a silicon controlled rectifier, conduction may occur in either direction.

In order to switch on the triac at or near the zero passage of the voltage, complicated circuits which draw large current have been used in past devices to avoid applying the input signal until the zero passage time occurs in the next alternating current cycle. For example, the circuit disclosed in U.S. Pat. No. 3,648,075 utilizes two diode bridges, an SCR, four transistors, three capacitors, a transformer, and additional circuitry. Such an arrangement is comparatively complex and draws a substantial amount of current to energize these components.

An object of the invention is to avoid these difficulties.

Another object of the invention is to improve devices at this time.

SUMMARY OF THE INVENTION

According to a feature of this invention, these objects are obtained, in whole or in part, by saturating one of two complementarily poled transistors between the control electrode and a main electrode of the tirac whenever the AC voltage exceeds a predetermined absolute value while applying the input signal to the control electrode. In this way, only when the AC voltage is less than the absolute value, in either direction, the input voltage can trigger the triac.

According to another feature of the invention, one of two diodes is connected in series with each of the complementary transistors and poled with the transistor. This maintains the unidirectionality of the transistors.

According to another feature of the invention, two back-to-back diodes connect the parallel connected diode-transistor circuits to the gate electrodes. These second pair of diodes compensate for the voltage drop appearing across the diodes in series with the transistors.

According to another feature of the invention, a light-emitting diode optically coupled to a photoresistor applies the input signal to the gate electrode, preferably through the back-to-back diodes.

These and other features of the invention are pointed out in the claims. Other objects and advantages of the invention will be evident from the following detailed description when read in light of the accompanying drawings.

DETAILED DESCRIPTION OF PREFERRED EMBODIMENTS

Figure 1:
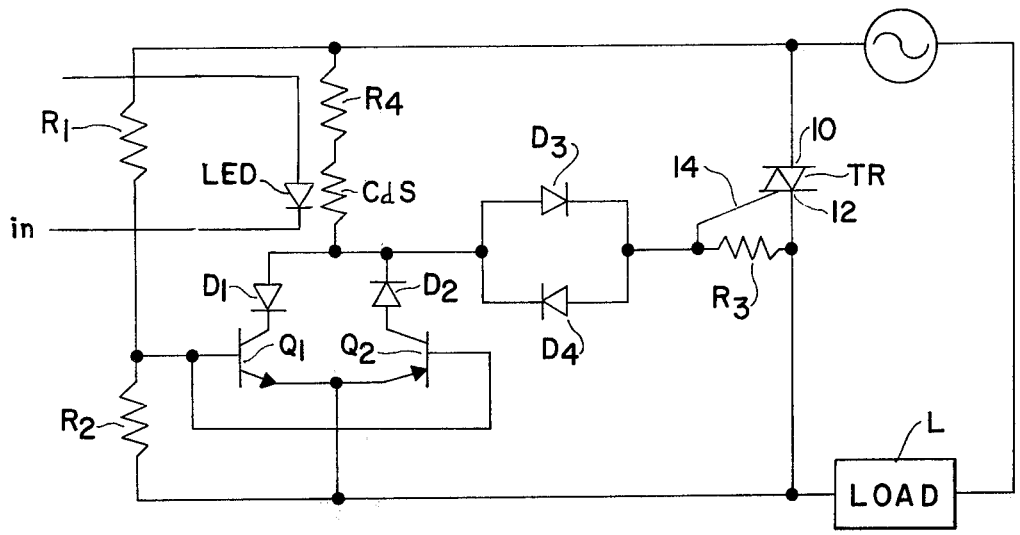
FIG. 1 is a circuit diagram of a system embodying features of the invention.

In FIG. 1 a triac Tr with main electrodes 10 and 12 connects a source S to a load L. Two resistors R1 and R2 form a voltage divider which senses the voltage across the triac TR and applies the voltage appearing at the junction between the resistors to the bases of two complementarily poled transistors Q1 and Q2. The emitters of the transistors Q1 and Q2 are connected to the electrode 12 and the resistor R2. Two oppositely poled diodes D1 and D2 connect the respective collectors of transistors Q1 and Q2 to the gate or control electrode 14 of the triac Tr through two back-to-back oppositely poled diodes D3 and D4. A high resistance R3 connects the control electrode 14 to the main electrode 12 so as to bias the gate 14.

An input signal is applied to the control electrode 14, through the diodes D3 and D4, by a light-emitting diode LED optically coupled to a photoresistor CdS. The latter is connected to the electrode 10 by means of a resistor R4.

Figure 2:
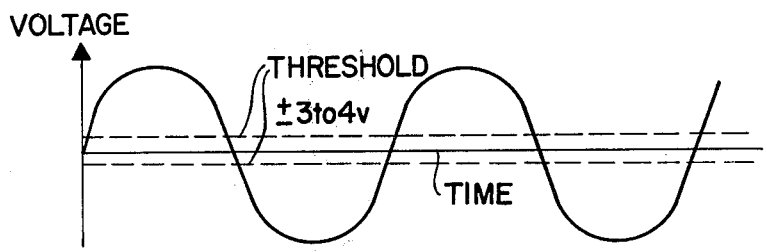
FIG. 2 is a graph illustrating the voltage applied across the switch of the circuit in FIG. 1.

In operation, when the source S applies a voltage to the load L, a voltage waveform such as that shown in FIG. 2 appears across the electrodes 10 and 12. As long as the voltage exceeds a predetermined absolute value, a value above a positive threshold or below a negative threshold, the voltage divider R1, R2 applying a proportion of this voltage to the bases of transistors Q1 and Q2 saturates one of the transistors Q1 or Q2, depending upon the polarity of the cycle. If the polarity is positive, current then flows through the resistor R4, the photoresistor CdS, the diode D1, and the saturated transistor Q1. If we neglect the voltage drops in the diodes D1, D3, and D4, the voltage drop between the control electrode 14 and the main electrode 12 is close to zero, i.e. equal to the voltage drop across the saturated transistor Q1. The diode D1 adds an additional voltage drop, but this voltage drop is compensated for by the voltage drop across the diodes D3 and D4.

Any input signal appearing at the diode LED reduces the resistance of the photoresistors Cds. However, the saturation of transistor Q1 effectively disables the control electrode 14 and therefore prevents the input signal from affecting the triac TR.

As the positive voltage across the electrodes 10 and 12 decreases, the voltage between the resistors R1 and R2 eventually becomes insufficient to maintain saturation of the transistor Q1. This effectively produces a high resistance between the electrode 12 and the control electrode 14. Now, any low resistance in the photoresistors CdS created by an input signal at the diode LED raises the control electrode voltage through the diodes D3 and D4 to a value sufficiently great to trigger the triac TR. This causes current flow from the source through the load L. Of course, the values of resistors R1 and R2 are such as to prevent the transistor Q1 from leaving the saturated region until the voltage across the electrode 10 and 12 is below the positive threshold level, i.e. the absolute value such as 3 or 4 volts.

Reversal of the voltage across the triac TR would normally turn off the latter. However, at this point the voltage between the voltage dividing resistors R1 and R2 is insufficient to saturate either the transistor Q1 or Q2. Therefore, a signal applied by the diode LED to the photoresistor CdS is sufficient to lower the photoresistor value and bring the voltage of control electrode 14 down to the negative value close to that of the electrode 10. This turns on the triac TR anew. The TR now remains on for the remainder of the negative half cycle. If the input signal at the diode LED continues, the photoresistor CdS always biases the control electrode 14, through the resistor R4, close to the voltage of the electrode 10. This keeps the triac TR on for succeeding half cycles.

At the close of each half cycle, if the input signal at the diode LED does not occur, the photoresistors CdS exhibit a high impedance and fails to bias the gate. 14 to a value sufficient to trigger the triac TR. Therefore, the triac TR is turned off at the end of the half cycle.

During a negative half cycle, if the triac is off, and the voltage between the electrodes 10 and 12 exceeds the threshold value, the voltage between the voltage dividing resistors R1 and R2 saturate the transistor Q2. A current then flows from the emitter of the transistor Q2 through its collector, through the diode D2, through the photoresistor CdS, and through the resistor R4. This effectively disables the input electrode 14. But when the negative voltage rises toward the zero level above the threshold value, the transistor Q2 is no longer saturated and the gate 14 enabled. In the absence of an input signal, the triac TR then remains off. In the presence of an input signal at the diode LED, the photoresistor CdS biases the electrode 14 through the diodes D3 and D4 to a value close to that of the electrode 10 and turns on the triac. The triac remains on for the next half cycle, and subsequent half cycles depending upon the absence or presence of the input signal.

Figure 3:
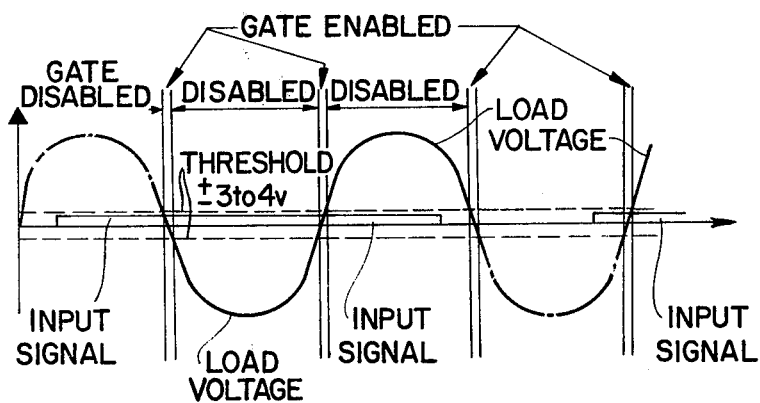
FIG. 3 is a diagram of the voltage appearing across the load as a result of the operation of the switch.

Effectively therefore, the circuit according to the invention provides a relay which connects a source S to a load L in response to an input signal at a diode LED. The operation in response to the input signal is shown in FIG. 3. In order to prevent the triac from being triggered during a high voltage moment in the cycle, and thereby to prevent transient currents, the control electrode 14 is disabled at all times but those in which the absolute value across the electrodes 10 and 12 is below three or four volts. This is accomplished by saturating transistors Q1 and Q2 with voltages produced by the voltage dividing resistors R1 and R2 when the voltage appearing across the electrodes 10 and 12 exceeds the absolute threshold values, three or four volts. In its disabled state, the transistor Q1 is saturated in response to a positive voltage at the electrode 10 relative to the electrode 12. The transistor Q2 is saturated when the voltage 10 is more negative than the voltage 12 and the voltage exceeds the absolute value of three or four volts. In this disabled state, the input signal cannot affect the value of the photoresistor sufficiently to trigger the triac TR. When the voltage falls to a value less than the absolute threshold value, the saturated transistor no longer saturates and the control electrode 14 is biased mainly by the resistor R4 and the photoresistor CdS. Since the photoresistors CdS has a low value in response to an input signal through the diode LED, the triac TR is triggered near this zero passage. This avoids undesirable transients. The triac TR continues conducting for the half cycle. If the input signal remains at the diode LED, the triac continues conducting for the next half cycle. If the input signal has disappeared by the end of the next half cycle, reversal of the triac voltage at the main electrode turns off the triac until the next signal that appears near the zero passage, i.e., less than the absolute threshold value, of the voltage across the electrodes 10 and 12.

The diodes D1 and D2 maintain the directionality of the transistors Q1 and Q2. The diodes D3 and D4 compensate for the rise in voltage introduced by the diodes D1 and D2.

While an embodiment of the invention has been described in detail, it will be evident that the invention may be embodied otherwise without departing from its spirit and scope. For example, the input signal may be applied between the resistor R4 and the diodes D1 and D2 with a transistor or other variable impedance.

What is claimed is:

1. An alternating current switch circuit, comprising a bilateral switch having a control terminal and output terminals, variable impedance means for producing a variable impedance, coupling means coupling said variable impedance means from one of the output terminals to the control terminal for applying the voltage of one of the output terminals to the control terminal so as to turn on the switch when the impedance of the impedance means is lower than a given value, input means coupled to the variable impedance means for varying the impedance to a given value to turn on the switch, voltage sensing means for sensing voltages, bilateral switching means for exhibiting a high impedance when turned off and a low impedance when turned on, said bilateral switching means connecting said impedance means to the other terminal and being connected to said voltage sensing means while said voltage sensing means is connected across the output terminals so that when the sensing means senses a value higher than a given value, said sensing means turns on said bilateral switching means and disables said bilateral switch, said bilateral switching means including parallel current paths, and complementarily poled transistors each in one of said paths, said transistors having bases connected to said sensing means, each of said paths including a diode in series with the transistor of said path and poled with the transistor of said path, said coupling means including a pair of inverse parallel diodes connecting said impedance means to said control terminal.

2. A circuit as in claim 1, wherein said impedance means includes a photoresistor and an light-emitting diode optically coupled to said photoresistor.

3. A circuit as in claim 2, wherein said bilateral switch is a triac.

4. A circuit as in claim 2, wherein said impedance means includes a fixed resistor and said photoresistor.

5. A circuit as in claim 4, wherein a high impedance connects said control terminal to one of said output terminals.

* * * * *